United States Patent
Yu et al.

(10) Patent No.: US 8,410,669 B2
(45) Date of Patent: Apr. 2, 2013

(54) PIEZOCERAMIC TRANSDUCER AND METHOD FOR MANUFACTURING THE SAME

(75) Inventors: Cheng-Sheng Yu, Kaohsiung (TW); Wu-Song Chung, Koahsiung (TW)

(73) Assignee: China Steel Corporation, Kaohsiung (TW)

( * ) Notice: Subject to any disclaimer, the term of this patent is extended or adjusted under 35 U.S.C. 154(b) by 88 days.

(21) Appl. No.: 12/970,023

(22) Filed: Dec. 16, 2010

(65) Prior Publication Data

US 2012/0074819 A1 Mar. 29, 2012

(30) Foreign Application Priority Data

Sep. 24, 2010 (TW) .............................. 99132479 A

(51) Int. Cl.
*H01L 41/047* (2006.01)
(52) U.S. Cl. ................. 310/363; 310/320; 310/365
(58) Field of Classification Search ................. 310/363, 310/365, 320
See application file for complete search history.

(56) References Cited

U.S. PATENT DOCUMENTS

| | | | |
|---|---|---|---|
| 4,257,989 A | 3/1981 | Nishikawa | |
| 4,976,259 A | 12/1990 | Higson et al. | |
| 5,021,701 A | 6/1991 | Takahashi et al. | |
| 5,757,104 A | 5/1998 | Getman et al. | |
| 7,030,538 B2 * | 4/2006 | Nakatsuka et al. | 310/312 |
| 7,456,708 B2 * | 11/2008 | Chou et al. | 333/187 |
| 2002/0130592 A1 * | 9/2002 | Hu et al. | 310/359 |
| 2006/0159490 A1 * | 7/2006 | Nakanishi et al. | 399/202 |
| 2007/0090731 A1 * | 4/2007 | Namba et al. | 310/359 |
| 2009/0058230 A1 * | 3/2009 | Kear et al. | 310/363 |
| 2009/0243442 A1 * | 10/2009 | Osawa | 310/366 |
| 2011/0156539 A1 * | 6/2011 | Park et al. | 310/366 |

FOREIGN PATENT DOCUMENTS

JP 2000-049399 * 2/2000

OTHER PUBLICATIONS

"Ultrasonic Transducer" by Takahashi Minoru; "Application of Piezoceramics" edited by Okazaki Kiyoi, Ichinose Noboru, Igarashi Syuji, Ono Ryuji, and Yamamoto Hirotaka, and published by Gakkensya, pp. 184-191(1988).

* cited by examiner

*Primary Examiner* — Walter Benson
*Assistant Examiner* — Bryan Gordon
(74) *Attorney, Agent, or Firm* — WPAT, P.C.; Anthony King

(57) ABSTRACT

A piezoceramic transducer (PZT transducer) and a method for manufacturing the same are provided. The PZT transducer includes a piezoceramic substrate and an electrode unit. The piezoceramic substrate has a first surface and a second surface opposite the first surface, and has a mechanical quality factor ($Q_m$) greater than 1400. The electrode unit has a first electrode and a second electrode. The first electrode is disposed on the first surface and has a first diameter. The second electrode covers the second surface and extends to cover a part of the surface at a periphery of the first surface, and the part of the second electrode covering the second surface has a second diameter. The ratio of the first diameter to the second diameter is 0.498 to 0.502. The PZT transducer has a large mist amount and a long service life.

8 Claims, 5 Drawing Sheets

PIEZOCERAMIC TRANSDUCER AND METHOD FOR MANUFACTURING THE SAME

BACKGROUND OF THE INVENTION

1. Field of the Invention

The present invention relates to a piezoceramic device and a method for manufacturing the same, and more particularly, to a piezoceramic transducer (PZT transducer) and a method for manufacturing the same.

2. Description of the Related Art

In prior art, a PZT transducer is applicable to an atomizing humidifier, and is capable of generating ultrasonic waves in water to raise a water column, so that Rayleigh wave liquid droplets of surface acoustic waves are sprayed at an interface of the water column and the air and blown into the air by a fan, thereby transporting mist droplets into the ambient environment to achieve the purpose of increasing the humidity of the environment. The size of the liquid droplet depends on the ultrasonic frequency; the higher the frequency, the smaller the liquid droplet, and the smaller the mist amount in the liquid droplet transporting device.

Some conventional atomizing humidifiers spray out small liquid droplets of drug with ultrasonic waves which are inhaled into the lungs through the nose, so as to treat diseases (such as asthma). Some conventional atomizing humidifiers spray out liquid droplets of detergent with ultrasonic waves which permeate and are distributed on dishes, so as to remove grease with a small amount of water, thereby achieving a water-saving function of the dishwasher. In addition to generating water droplets, some conventional atomizing humidifiers generate ozone through high-voltage point discharge; the ozone floats in the air with the water droplets, and then is inhaled by human body to achieve the health-enhancing effect of antioxidant.

Prior-art design of the atomizing humidifier focuses on how to generate a large amount of water droplets (referred to as mist amount) with a low input of electric energy, and the design emphasis is on the liquid droplet transporting device, the power supply, and the vibration circuit. As the water amount in the spray water tank gradually decreases, the transducer still performs ultrasonic vibration; since ultrasonic energy cannot be transported without water, the transducer will become excessively hot due to energy accumulation and malfunction when the temperature exceeds the Curie temperature. In order to prevent such situation, the design focuses on detection of storage water level and automatic control of water input from a large water tank to the spray water tank by maintaining a certain distance between the vibration plane of the transducer and the liquid level, controlling the angle of inclination of the transducer to the liquid level, or adding a duct to remove large liquid droplets, so as to obtain a large or stable spray amount.

In recent years, the demand for light, thin, small, and portable atomizing humidifiers has increased, and small-power spraying devices have gradually become the trend. In the design, a piezoceramic plate is used to generate vibration to extrude the liquid to pass through a metal sheet with small holes to generate mist droplets. The design of atomizing humidifier construction is adopted in most cases, but few discussions on how to manufacture a PZT transducer having a large spray amount and a long service life exist in documents and patents.

Several prior art documents about atomizing humidifier transducers are listed and described briefly below.

Prior art document 1: "Ultrasonic Transducer" by Takahashi Minoru; "Application of Piezoceramics" edited by Okazaki Kiyoi, Ichinose Noboru, Igarashi Syuji, Ono Ryuji, and Yamamoto Hirotaka, and published by Gakkensya, pp. 184-191 (1988).

Some qualitative and theoretical explanations of manufacturing of the atomizing humidifier transducer are set forth, but the effects of electrode design and adhesion process of the transducer on the mist amount are not disclosed.

Prior art document 2: U.S. Pat. No. 4,257,989A (TDK atomizing humidifier)

Structure combination of an atomizing humidifier and electrode arrangement of a transducer are disclosed, but the relevant manufacturing method and performance of the transducer are not disclosed.

Prior art document 3: U.S. Pat. No. 5,021,701A (TDK transducer erecting transducer)

Electrode arrangement of a transducer is disclosed, but the relevant manufacturing method and performance of the transducer are not illustrated.

Prior art document 4: U.S. Pat. No. 4,976,259 (Medical Ultrasonic Nebulizer)

A nebulizer is disclosed, which uses a transducer with the same electrode arrangement, but how to obtain a large mist amount is not illustrated.

Prior art document 5: U.S. Pat. No. 5,757,104 (Optimal matching method of transducer and circuit).

An optimal matching method of a transducer and a circuit is disclosed, in which the transducer with the same electrode arrangement or different electrode arrangements is capable of matching an optical vibration circuit to obtain the maximal vibration, but how to obtain the maximal vibration (mist amount) through a ratio of the electrode diameter of the transducer to the diameter of the ceramic plate is not illustrated.

Therefore, it is necessary to provide an innovative and inventive PZT transducer and a method for manufacturing the same.

SUMMARY OF THE INVENTION

The present invention provides a PZT transducer, which includes a piezoceramic substrate and an electrode unit. The piezoceramic substrate has a first surface and a second surface opposite the first surface, and has a mechanical quality factor ($Q_m$) greater than 1400. The electrode unit has a first electrode and a second electrode. The first electrode is disposed on the first surface and has a first diameter. The second electrode covers the second surface and extends to cover a part of the surface at a periphery of the first surface, and the part of the second electrode covering the second surface has a second diameter. The ratio of the first diameter to the second diameter is 0.498 to 0.502.

The present invention also provides a method for manufacturing a PZT transducer, which includes: (a) providing a piezoceramic substrate, in which the piezoceramic substrate has a first surface and a second surface opposite the first surface, and has a mechanical quality factor ($Q_m$) greater than 1400; and (b) forming an electrode unit on the piezoceramic substrate, in which the electrode unit has a first electrode and a second electrode, the first electrode is disposed on the first surface and has a first diameter, the second electrode covers the second surface and extends to cover a part of the surface at a periphery of the first surface, the part of the second electrode covering the second surface has a second diameter, and the ratio of the first diameter to the second diameter is 0.498 to 0.502.

As a piezoceramic material having a high mechanical quality factor $Q_m$ ($Q_m>1400$) is selected, the ratio of the diameter of the first electrode to that of the second electrode on two opposite sides of the piezoceramic material is set in a suitable range, and the thickness of a bonding material for disposing a foil is controlled in a suitable range, so as to manufacture a PZT transducer having a large mist amount and long service life.

DETAILED DESCRIPTION OF THE INVENTION

Figure 1:
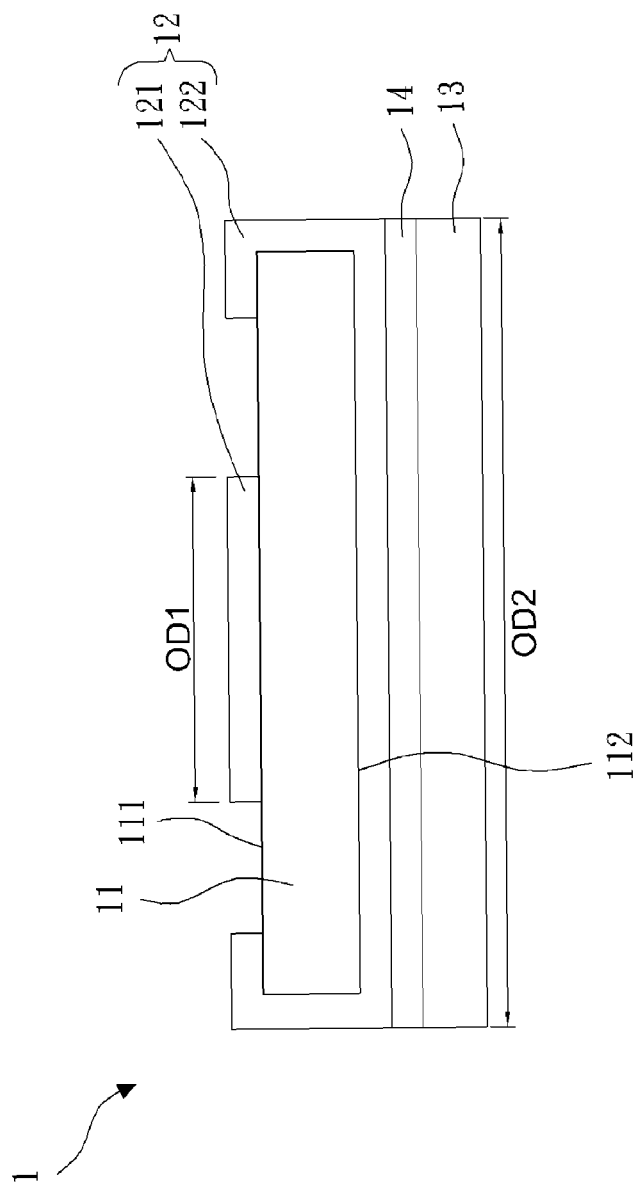
FIG. 1 is a cross-sectional view of a PZT transducer according to the present invention.
Figure 2:
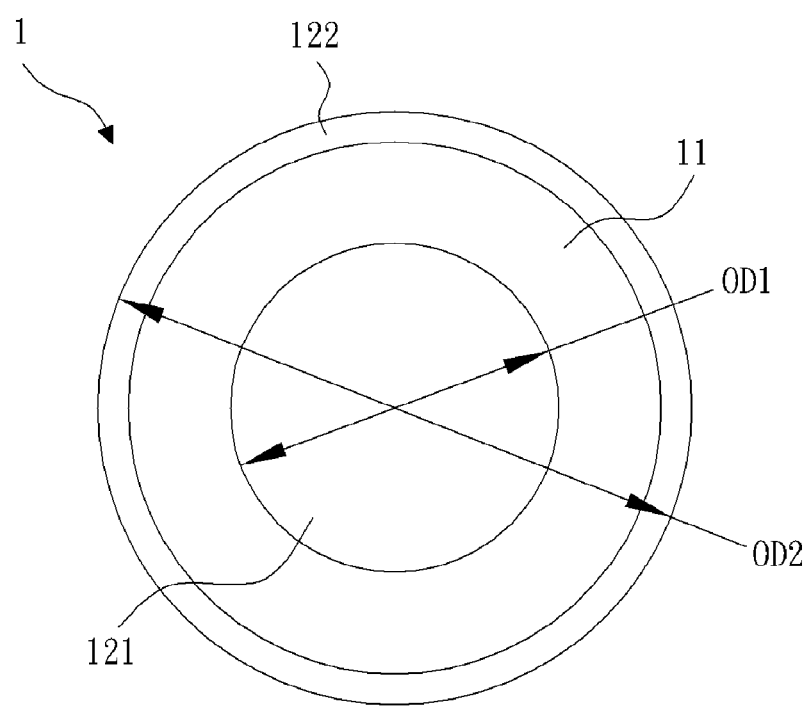
FIG. 2 is a top view of the PZT transducer according to the present invention.

FIG. 1 is a cross-sectional view of a PZT transducer according to the present invention, and FIG. 2 is a top view of the PZT transducer according to the present invention. As shown in FIGS. 1 and 2, in this embodiment, the PZT transducer is, but is not limited to, a PZT transducer used in an atomizing humidifier. The PZT transducer 1 includes a piezoceramic substrate 11, an electrode unit 12, a foil 13, and a bonding material 14. The piezoceramic substrate 11 has a first surface 111 and a second surface 112 opposite the first surface 111, and has a mechanical quality factor ($Q_m$) greater than 1400.

The electrode unit 12 has a first electrode 121 and a second electrode 122. The first electrode 121 is disposed on the first surface 111 and has a first diameter OD1. The second electrode 122 covers the second surface 112, and extends to cover a part of the surface at a periphery of the first surface 111, and the part of the second electrode 122 covering the second surface 112 has a second diameter OD2. In this embodiment, the first electrode 121 and the second electrode 122 are silver electrodes. The ratio of the first diameter OD1 to the second diameter OD2 is 0.498 to 0.502.

The foil 13 is disposed on a side of the piezoceramic substrate 11 and opposite the second surface 112. In this embodiment, the foil 13 is a metal material. Preferably, the foil 13 is a stainless steel (for example, 304 or 316 stainless steel) foil or a titanium foil, and the thickness of the foil 13 is preferably 20 micrometers (μm) to 30 μm. In this embodiment, the bonding material 14 is epoxy resin, and is disposed between the second electrode 122 and the foil 13. Preferably, the thickness of the bonding material 14 is smaller than 12 μm.

It can be understood that the PZT transducer 1 according to the present invention may not have a foil and a bonding material and can still work and generate a vibration effect.

Figure 3:
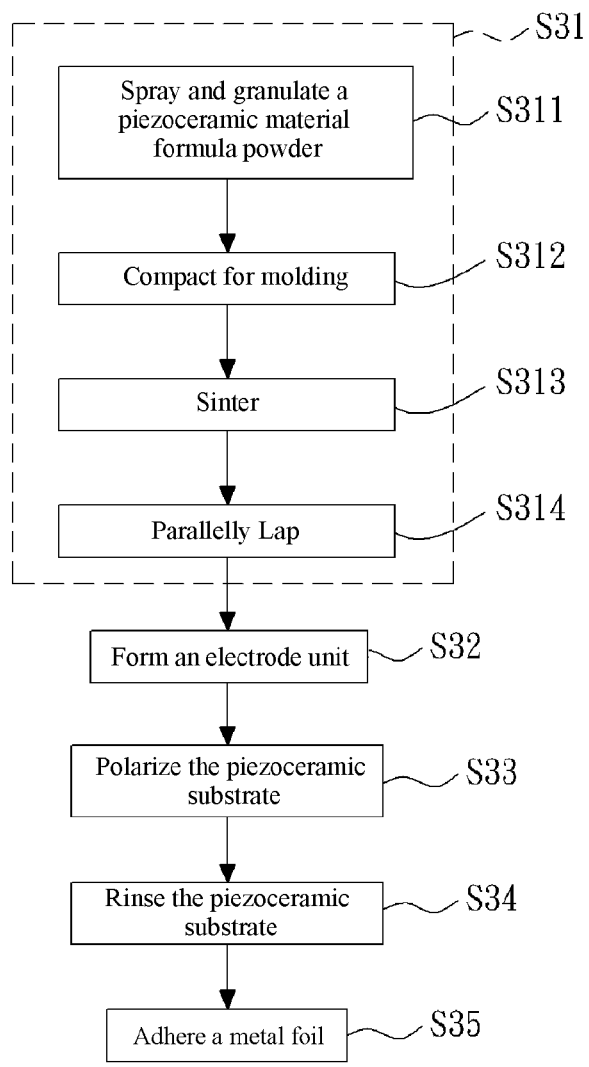
FIG. 3 is a flow chart of a method for manufacturing a PZT transducer according to the present invention.

FIG. 3 is a flow chart of a method for manufacturing a PZT transducer according to the present invention. As shown in FIGS. 1 to 3, first, in Step S31, a piezoceramic substrate 11 is provided, in which the piezoceramic substrate 11 has a first surface 111 and a second surface 112 opposite the first surface 111, and has a mechanical quality factor ($Q_m$) greater than 1400.

In this embodiment, Step S31 includes the following steps. In Step S311, a piezoceramic material formula powder is calcined, finely ground, and formulated into slurry, and then the slurry is sprayed and granulated, so as to form piezoceramic material granules. In Step S312, the piezoceramic material granules are compacted for molding a compacted piezoceramic material. In Step S313, the compacted piezoceramic material is sintered. In Step S314, the sintered piezoceramic material is parallelly lapped, so as to form the piezoceramic substrate 11.

In Step S32, an electrode unit 12 is formed on the piezoceramic substrate 11. In this embodiment, in Step S32, an electrode substrate is coated on surfaces of the piezoceramic substrate 11, in which the electrode substrate is disposed on the first surface 111, covers the second surface 112, and extends to cover a part of the surface at the periphery of the first surface 111. The electrode substrate is fired, so as to form the electrode unit 12. The thickness of the coated electrode substrate is preferably 0.01 mm to 0.002 mm. The electrode unit 12 has a first electrode 121 and a second electrode 122. The first electrode 121 is disposed on the first surface 111 and has a first diameter OD1. The second electrode 122 covers the second surface 112 and extends to cover a part of the surface at the periphery of the first surface 111, and the part of the second electrode 122 covering the second surface 112 has a second diameter OD1. Preferably, the ratio of the first diameter to the second diameter is 0.498 to 0.502.

In this embodiment, after the electrode unit 12 is formed, the method further includes Step S33, polarizing the piezoceramic substrate 11. In this embodiment, the piezoceramic substrate 11 is polarized with high voltage. Moreover, after the piezoceramic substrate 11 is polarized, the method further includes Step S34, rinsing the piezoceramic substrate.

In Step S35, a foil 13 is disposed on a side of the piezoceramic substrate 11 and opposite the second surface 112. In this embodiment, the foil 13 is a metal material (a metal foil), and a bonding material 14 is disposed between the second electrode 122 and the foil 13.

In application of the ultrasonic atomizing humidifier, the PZT transducer 1 according to the present invention is welded with wires or contacts with a conductive ring, and then is placed in a waterproof rubber sleeve or a specially designed plastic seat shell. Finally, the mist amount of the PZT transducer 1 may be evaluated with a fixed vibration circuit and input power.

Selection of Material of PZT Transducer

The PZT transducer 1 generates ultrasonic waves through vibration in the thickness direction. For example, the PZT transducer 1 used in the atomizing humidifiers in the market has a frequency $f_r$ of about 1-3 MHz, so the vibration frequency may be changed by changing the thickness of the piezoceramic substrate 11. Commonly used frequencies include 1.65 MHz, 2.4 MHz, and 2.8 MHz, and the corresponding thickness of the piezoceramic substrate 11 needs to be gradually decreased. The PZT transducer 1 in the atomizing humidifier is placed at the bottom in water, and a vibration amplitude ξ is relevant to an applied voltage E, a piezoelectric strain constant $d_{33}$, and a mechanical quality factor $Q_L$ in water, and is expressed by the formula below:

$$\xi = d_{33} \cdot E \cdot Q_L \tag{1}$$

The mechanical quality factor $Q_L$ in water represents the kinetic energy consumed in the form of heat energy by the piezoceramic substrate 11 when the PZT transducer 1 vibrates, and is relevant to the mechanical quality factor $Q_m$ of the material of the piezoceramic substrate 11. The greater the mechanical quality factor $Q_m$ of the piezoceramic substrate 11, the less the heat energy consumed. Similarly, the greater the $Q_L$, the less the input power energy consumed in the form or heat energy, and the greater the vibration amplitude. Furthermore, generally speaking, the greater the piezoelectric strain constant $d_{33}$ of a material, the smaller the mechanical quality factor $Q_m$. With the development of new piezoceramic materials, such as the piezoceramic material with low $d_{33}$ and high $Q_m$, it is unknown whether a large mist amount can be generated when the piezoceramic material is applied to the atomizing humidifier.

Table 1 shows comparison results of piezoelectric characteristics of three PZT transducers (in which PZT-3 is an inventive example of the present invention), and comparison results of the mist amount of a 1.65 MHz ultrasonic transducer when driven by inputting electric energies of 24 W and 28 W. The results show that the PZT transducer with a high $Q_m$ value (inventive example PZT-3, with a $Q_m$ greater than 1400) obviously has a large mist amount, while the PZT transducer with a high $d_{33}$ (comparative examples PZT-1 and PZT-2) has a small mist amount.

TABLE 1

| | Piezoelectric strain constant $d_{33}$ | Electromechanical coupling coefficient | Mechanical quality | Mist amount (c.c./min) | |
|---|---|---|---|---|---|
| | ($10^{-12}$ m/V) | kp (%) | factor $Q_m$ | 24 W | 28 W |
| Comparative Example 1, PZT-1 | 450 | 65 | 500 | 2.9 | 4.9 |
| Comparative Example 2, PZT-2 | 380 | 62 | 1400 | 3.5 | 5.8 |
| Inventive example PZT-3 | 280 | 61 | 2000 | 4.1 | 6.6 |

As shown in Table 1, the piezoelectric characteristics of PZT-1 include $d_{33}$-450 and $Q_m$-500, and when the $Q_m$ value is greater than 1400, 1.65 MHz PZT transducer can have a mist amount of about 350 c.c./h when driven by inputting the electric energy of 28 W, which meets the minimum requirement for high mist amount on the market. It is emphasized that the mist amount of the atomizing humidifier with a PZT transducer made of a piezoceramic plate with $Q_m$>2000 is superior to that of other atomizing humidifiers on the market (such as ultrasonic transducer manufactured by TDK or Fukoku). When the PZT transducer with a high $Q_m$ is placed in water, although heat is taken away after by water, the quality factor $Q_L$ of the PZT transducer still fully reflects the essential characteristic $Q_m$ of the material, thereby having a decisive influence on the vibration amplitude of the PZT transducer.

Electrode Design of PZT Transducer

In the present invention, the electrode unit 12 of the PZT transducer 1 applied to the atomizing humidifier is arranged by coating a central circular silver electrode (first electrode 121) having a diameter of OD1 on the first surface 111 of the piezoceramic substrate 11, and coating a back silver electrode (second electrode 122) on the entire surface of the second surface 112 of the piezoceramic substrate 11, the entire side surfaces of the piezoceramic substrate 11, and a part of the surface of the periphery of the first surface 111, in which the part of the silver electrode covering the second surface 112 has a second diameter OD2.

For example, in a piezoceramic substrate 11 having a diameter of 20 mm, the central circular silver electrode of the first surface 111 has a diameter OD1 of about 10 mm, and the part of the electrode extending from the second surface 112 to the first surface 111 provides an input electric energy for a conductive ring. The PZT transducer 1 applicable to the atomizing humidifier vibrates in the thickness direction, and the thickness vibration is limited below the central circular silver electrode. The back surface of the PZT transducer 1 (located on a side of the second surface 112) contacts water and is an end surface for outputting ultrasonic waves. However, it is noted that the area of the central circular silver electrode (that is, a region of the electric dipole in the piezoceramic substrate 11 that is orderly arranged through external high-voltage polarizing) is the range in which the ultrasonic waves can be output, so the output energy and the output strength of the ultrasonic waves per unit area have to do with the area of the center circular silver electrode.

Although the PZT transducer 1 outputs the ultrasonic waves in thickness vibration, plane vibration also exists. Due to the difference between the area of the back silver electrode and the area of the center circular silver electrode of the PZT transducer 1, the vibration boundary conditions of the plane vibration are changed, changing the electromechanical coupling coefficient of the PZT transducer 1 at the same time, so the proportion of the electric energy converted into the mechanical energy is changed.

TABLE 2

| Application frequency of the transducer | Thickness of ceramic plate t (mm) | OD1 (mm) | OD2 (mm) | Mist amount (c.c./min) |
|---|---|---|---|---|
| 1.65 MHz | 1.23~1.25 | 12.9 | 20 | 3.39 |
| 1.65 MHz (Inventive example) | 1.23~1.25 | 13.1 | 20 | 4.13 |
| 1.65 MHz | 1.23~1.25 | 13.3 | 20 | 3.85 |
| 2.4 MHz | 0.84~0.86 | 10.05 | 20 | 2.68 |
| 2.4 MHz (Inventive example) | 0.84~0.86 | 10 | 20 | 2.94 |
| 2.4 MHz | 0.84~0.86 | 9.97 | 20 | 2.73 |
| 2.4 MHz | 0.84~0.86 | 9.95 | 20 | 2.57 |
| 2.4 MHz | 0.84~0.86 | 9.93 | 20 | 2.29 |

Table 2 shows influence of the ratio of the diameter OD1 of the central circular silver electrode to the diameter OD2 of the back silver electrode of the PZT-3 PZT transducer in Table 1 on the mist amount under two vibration frequencies (1.65 MHz and 2.4 MHz). The 1.65 MHz and the 2.4 MHz PZT transducers are driven by inputting electric energies of 24 W and 12 W, respectively.

As can be seen from Tables 1 and 2, the PZT transducers with a back silver electrode having a diameter OD2 of 20 mm and having the frequencies of 1.65 MHz and 2.4 respectively MHz are manufactured with the PZT-3 piezoceramic substrate, wherein the thickness t is 1.23-1.25 mm and 0.84-0.86 mm respectively, the diameter OD1 of the central circular silver electrode is changed to 12.9-13.3 mm and 10.93-11.05 mm respectively, and the electric energies of 24 W and 12 W are respectively input to compare and evaluate the differences in the mist amount.

Table 2 shows that, for the 1.65 MHz and the 24 MHz PZT transducers, in order to obtain the maximal mist amount, the ratio (OD1/OD2) of the diameter OD1 of the central circular silver electrode to the diameter OD2 of the back silver electrode needs to be an optimal ratio value. When the diameter ratio (OD1/OD2) value changes, the mist amount changes sharply. Therefore, if the atomizing humidifier is to obtain the maximal mist amount, the diameter ratio (OD1/OD2) needs to be strictly controlled.

Figure 4:
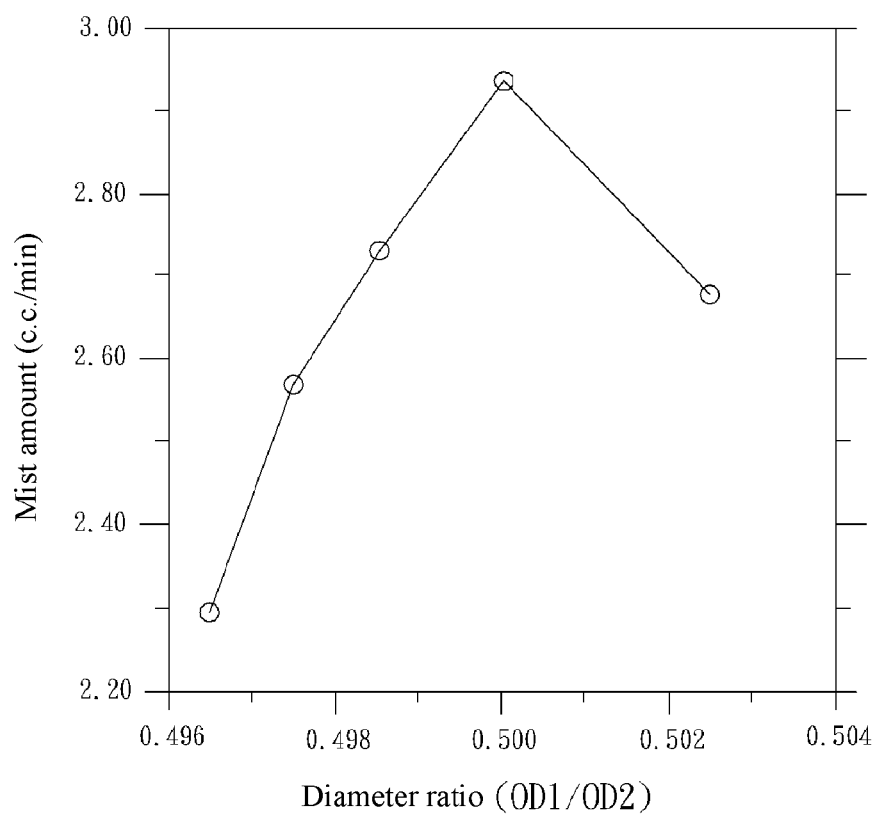
FIG. 4 shows a corresponding relation between a mist amount generated by a 2.4 MHz PZT transducer and a diameter ratio (OD1/OD2)

FIG. 4 shows a corresponding relation between the mist amount generated by the 2.4 MHz PZT transducer and the diameter ratio (OD1/OD2). In order to obtain a mist amount larger than 2.5 c.c./min when inputting an electric energy of 12 W, the ratio (OD1/OD2) is preferably in a range of 0.498-0.502.

Optimization of Glue Thickness for Adhering Metal Foil to PZT Transducer

When the PZT transducer 1 is applied to an atomizing humidifier, the back of the PZT transducer 1 directly contacts water or detergent liquid. If the back silver electrode directly contacts the liquid, corrosion will easily occur, which will shorten the service life of the PZT transducer 1, so a metal foil (foil 13) with a preferable corrosion resistance performance is preferably adhered to the PZT transducer 1. The metal foil includes a 304 or 316 stainless steel foil and a titanium foil, and has a thickness of about 20-30 μm. The metal foil directly faces the liquid to increase the corrosion resistance performance, so as to prolong the service life of the PZT transducer 1.

It is noted that a glue (a bonding material 14) is used to adhere the metal foil to the back silver electrode. An epoxy resin glue with a preferable adhering performance is used, in which the epoxy resin glue bonds the two metal surfaces (the back silver electrode and the metal foil) through hydrogen bonds. However, the glue thickness needs to be controlled appropriately, as excessively thick glue will absorb the vibration energy and impact the intensity of the ultrasonic waves. However, if the glue is too thin, the adhering strength may be too weak, resulting in easy peeling of the metal foil and thus shortening the service life of the PZT transducer.

In Table 3, the PZT-3 PZT transducer in Table 1 is screen-printed with an epoxy resin glue through three meshes of M200, M250, and M420, and a metal foil with a thickness of 30 μm is adhered by applying forces of 100 Kg and 200 Kg at a suitable temperature. The epoxy resin glue is cured after the temperature and the pressure are controlled, then the glue thickness is observed and analyzed, and the mist amount is evaluated.

TABLE 3

| Glue printing mesh | Applied force (Kg) | Glue thickness t (μm) | Mist amount (c.c./min) |
|---|---|---|---|
| 200 Mesh | 100 | 15 | 1.65 |
| | 200 | 14 | 1.81 |
| 250 Mesh | 100 | 13.4 | 2.22 |
| | 200 | 12 | 2.55 |
| 420 Mesh (Inventive example) | 100 | 11 | 2.98 |
| | 200 | 10 | 3.11 |

The glue is screen-printed through the meshes of M200, M250, and M420, with mesh apertures gradually getting smaller. The amount of the coated glue is decreased correspondingly, and the force used for adhesion is controlled so as to control the glue thickness. The PZT transducer is printed with the glue through the meshes of M200, M250, and M420 by respectively applying the forces of 100 Kg and 200 Kg, and then the glue is cured under the same condition, so as to control the glue thickness in the range of 10-15 μm. When the mesh M420 is used, the coating amount of the glue is smaller, and the glue thickness between the metal foil and the back silver electrode is smaller. The evaluation results of mist amounts of the PZT transducers with the different glue thicknesses are shown in Table 3.

Figure 5:
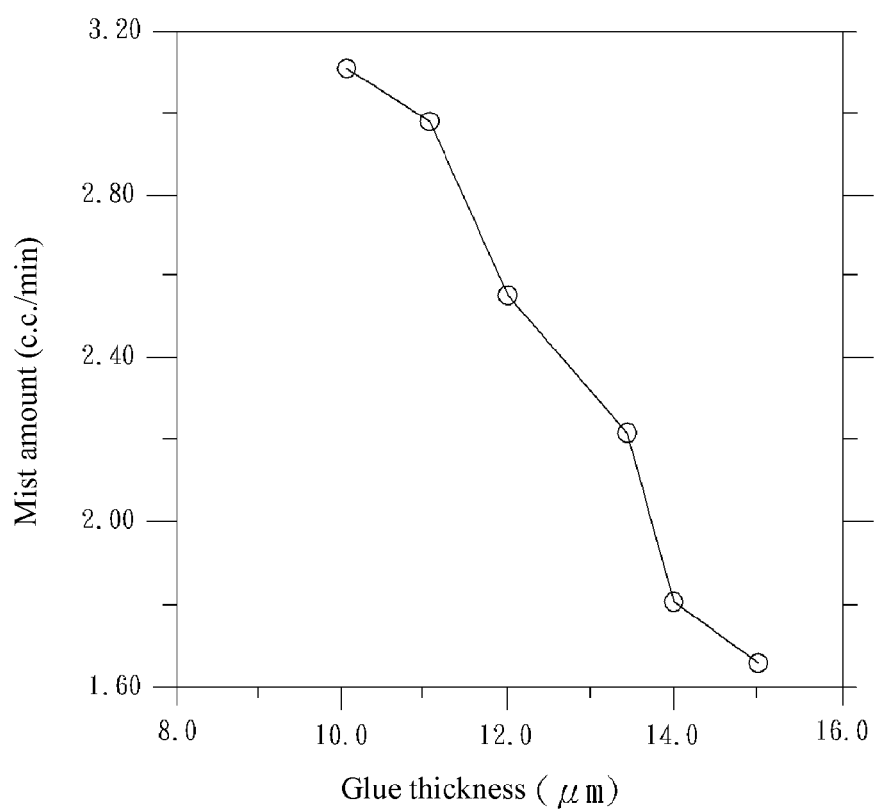
FIG. 5 shows a relation between a mist amount of the PZT transducer according to the present invention and a glue thickness.

FIG. 5 shows a relation between the mist amount of the PZT transducer and the glue (bonding material) thickness. As shown in FIG. 5, the smaller the glue thickness, the larger the mist amount, and the mist amount of the PZT transducer with a glue thickness <12 μm may be larger than 25 c.c./min. The PZT transducer with a glue thickness of about 10 μm has a bonding strength greater than 3 kg, and passes the long-term (more than 1000 h) continuous spraying life test.

In view of the above, by selecting the piezoceramic material 11 with the high mechanical quality factor $Q_m$ ($Q_m$>1400), setting the ratio (OD1/OD2) of the diameter of the first electrode 121 to the diameter of the second electrode 122 on two opposite sides of the piezoceramic material 11 in a suitable range (OD1/OD2=0.498-0.502), and controlling the thickness of the bonding material 14 for adhering the foil 13 in a suitable range (<12 μm), the PZT transducer 1 with the large mist amount and the long service life can be manufactured.

While embodiments of the present invention have been illustrated and described, various modifications and improvements can be made by those skilled in the art. The embodiments of the present invention are therefore described in an illustrative but not restrictive sense. It is intended that the present invention is not limited to the particular forms illustrated, and that all modifications that maintain the spirit and scope of the present invention are within the scope defined in the appended claims.

What is claimed is:

1. A piezoceramic transducer (PZT transducer), comprising:
    a piezoceramic substrate, having a first surface, side surfaces, and a second surface opposite the first surface, and having a mechanical quality factor (Qm) greater than 1400; and
    an electrode unit, having a first electrode and a second electrode, wherein the first electrode is disposed on the first surface and has a first diameter, the second electrode covers the second surface, the entire side surfaces, and extends to cover a part of the surface at a periphery of the first surface, the part of the second electrode covering the second surface has a second diameter, and the ratio of the first diameter to the second diameter is 0.498 to 0.502.

2. The PZT transducer according to claim 1, wherein the first electrode and the second electrode are silver electrodes.

3. The PZT transducer according to claim 1, further comprising a foil, disposed on a side of the piezoceramic substrate and opposite the second surface.

4. The PZT transducer according to claim 3, wherein the foil is a metal material.

5. The PZT transducer according to claim 4, wherein the foil is a stainless steel foil or a titanium foil.

6. The PZT transducer according to claim 3, wherein the foil has a thickness of 20 micrometers (μm) to 30 μm.

7. The PZT transducer according to claim 3, further comprising a bonding material, disposed between the second electrode and the foil.

8. The PZT transducer according to claim 7, wherein the bonding material has a thickness smaller than 12 μm.

* * * * *